United States Patent
Lee

(10) Patent No.: US 8,679,879 B2
(45) Date of Patent: Mar. 25, 2014

(54) METHOD FOR FABRICATING QUANTUM DOT AND SEMICONDUCTOR STRUCTURE CONTAINING QUANTUM DOT

(75) Inventor: Hong Seok Lee, Gwangju (KR)

(73) Assignee: Gwangju Institute of Science and Technology, Buk-Gu, Gwangju (KR)

( * ) Notice: Subject to any disclaimer, the term of this patent is extended or adjusted under 35 U.S.C. 154(b) by 90 days.

(21) Appl. No.: 13/325,528

(22) Filed: Dec. 14, 2011

(65) Prior Publication Data

US 2012/0267603 A1    Oct. 25, 2012

(30) Foreign Application Priority Data

Apr. 25, 2011  (KR) .................. 10-2011-0038620

(51) Int. Cl.
*H01L 21/336*    (2006.01)
(52) U.S. Cl.
USPC ............... 438/36; 257/E21.131; 438/797
(58) Field of Classification Search
USPC ............ 257/9, E21.131; 438/269, 36, 797; 977/759; 250/341.1
See application file for complete search history.

(56) References Cited

U.S. PATENT DOCUMENTS

| | | | |
|---|---|---|---|
| 5,843,802 A * | 12/1998 | Beernink et al. | 438/45 |
| 2004/0175852 A1* | 9/2004 | Ooi et al. | 438/22 |
| 2005/0153473 A1* | 7/2005 | Teng et al. | 438/47 |
| 2006/0192115 A1* | 8/2006 | Thomas et al. | 250/306 |
| 2009/0086784 A1* | 4/2009 | Li et al. | 372/50.11 |

* cited by examiner

*Primary Examiner* — Caridad Everhart
(74) *Attorney, Agent, or Firm* — Nath, Goldberg & Meyer; Joshua B. Goldberg

(57) ABSTRACT

Disclosed are a method for fabricating a quantum dot. The method includes the steps of (a) preparing a compound semiconductor layer including a quantum well structure formed by sequentially stacking a first barrier layer, a well layer and a second barrier layer; (b) forming a dielectric thin film pattern including a first dielectric thin film having a thermal expansion coefficient higher than a thermal expansion coefficient of the second barrier layer and a second dielectric thin film having a thermal expansion coefficient lower than the thermal expansion coefficient of the second barrier layer on the second barrier layer; and (c) heat-treating the compound semiconductor layer formed thereon with the dielectric thin film pattern to cause an intermixing between elements of the well layer and elements of the barrier layers at a region of the compound semiconductor layer under the second dielectric thin film.

6 Claims, 6 Drawing Sheets

METHOD FOR FABRICATING QUANTUM DOT AND SEMICONDUCTOR STRUCTURE CONTAINING QUANTUM DOT

CROSS-REFERENCE TO RELATED APPLICATION

This application claims the benefit under 35 U.S.C. §119 of Korean Patent Application No. 10-2011-0038620, filed on Apr. 25, 2011 in the Korean Intellectual Property Office, the entirety of which is incorporated herein by reference.

BACKGROUND OF THE INVENTION

1. Field of the Invention

The present invention relates generally to a method for fabricating a quantum dot and an application of the same. More particularly, the present invention relates to a method for fabricating a quantum dot by using a dielectric thin film pattern and a heat treatment process and a semiconductor structure containing the quantum dot fabricated through the method.

2. Description of the Related Art

A semiconductor quantum dot is a semiconductor structure obtained by selecting a material having a narrow bandgap from between two materials having bandgaps different from each other and growing the material in the other material having a wide bandgap to the extent that the material has a size corresponding to the de Broglie wavelength. The quantum dot has a bandgap that may three-dimensionally confine the motion of electrons and holes serving as carriers in a semiconductor. When comparing with bulk materials that do not confine the motion of the carriers, the quantum dot has unique and superior electric and optical characteristics. Thus, the studies and research to apply the quantum dot to semiconductor devices, such as an infrared detector, a laser, a light emitting diode, a transistor and a solar cell, have been actively pursued. Especially, single quantum dots, in which the quantum dots represent the same optical characteristics, have been applied as nano-electronic devices and nano-optical devices for single electron memories and single photon light sources. Among the nano-optical devices, a single photon emitter is a representative light source employing the single quantum dot. The single photon emitter is a very important element to realize the quantum cryptography or the quantum computer.

When a nano-device is fabricated by using the quantum dot, it is very important to control a position, a size and a concentration of the quantum dots. In general, according to the related art, a quantum well structure is etched or the S-K (Stranski-Krastanov) mode is used to spontaneously grow the quantum dots. However, when the etching scheme is employed, defects may occur due to the irregular atom arrangement at an edge of the quantum well structure. In the case of the growth scheme by using the S-K mode, it is difficult to accurately adjust the growth conditions, so the size, concentration and growth position of the quantum dots may not be precisely controlled.

SUMMARY OF THE INVENTION

Accordingly, the present invention has been made keeping in mind the above problems occurring in the prior art, and an object of the present invention is to provide a method for fabricating a quantum dot, capable of selectively controlling a position of the quantum dot while diminishing defects of a semiconductor device.

Another object of the present invention is to provide a semiconductor structure containing a quantum dot fabricated through the above method.

To accomplish the above objects, according to one aspect of the present invention, there is provided a method for fabricating a quantum dot. The method includes the steps of (a) preparing a compound semiconductor layer including a quantum well structure formed by sequentially stacking a first barrier layer, a well layer and a second barrier layer; (b) forming a dielectric thin film pattern including a first dielectric thin film having a thermal expansion coefficient higher than a thermal expansion coefficient of the second barrier layer and a second dielectric thin film having a thermal expansion coefficient lower than the thermal expansion coefficient of the second barrier layer on the second barrier layer such that the first dielectric thin film has a width of nanometer size; and (c) heat-treating the compound semiconductor layer formed thereon with the dielectric thin film pattern to cause an intermixing between elements of the well layer and elements of the barrier layers at a region of the compound semiconductor layer under the second dielectric thin film.

The compound semiconductor layer may include a group III-V compound semiconductor layer or a group II-VI compound semiconductor layer.

In addition, step (b) may include the steps of forming a resist layer on the second barrier layer; etching the resist layer to form a hole pattern that exposes a part of the second barrier layer; depositing one of the first and second dielectric thin films on the exposed part of the second barrier layer; and removing the resist layer remaining on the second barrier layer and depositing remaining one of the first and second dielectric thin films on the second barrier layer.

The first and second dielectric thin films may include metal oxide layers including at least one selected from the group consisting of $Al_2O_3$, $HfO_2$, $TiO_2$, $SnO_2$, $SiO_2$ and $ZrO_2$.

In step (c), the heat treatment may be performed for 50 seconds to 200 seconds at a temperature in a range of 300° C. to 900° C.

The method may further include the step of removing the dielectric thin film pattern after step (c).

To accomplish the above objects, according to another aspect of the present invention, there is provided a semiconductor structure containing a quantum dot. The semiconductor structure may include a compound semiconductor layer including a quantum well structure formed by sequentially stacking a first barrier layer, a well layer and a second barrier layer; and a dielectric thin film pattern formed on the second barrier layer and including a first dielectric thin film having a thermal expansion coefficient higher than a thermal expansion coefficient of the second barrier layer and a second dielectric thin film having a thermal expansion coefficient lower than the thermal expansion coefficient of the second barrier layer, wherein the first dielectric thin film has a width of nanometer size, and a well layer region formed under the second dielectric thin film has a bandgap wider than a bandgap of a well layer region formed under the first dielectric thin film.

As described above, according to the present invention, the quantum dot is formed by forming the dielectric thin film pattern and performing the heat treatment process, so defects may be diminished in the process of forming the quantum dot. In addition, since the size, concentration and growth position of the quantum dot can be controlled according to the size, shape and position of the dielectric thin film pattern, so the quantum dot can be selectively grown corresponding to the function of target devices.

The effects of the present invention may not be limited to the above effects, and other effects of the present invention may be comprehended to those skilled in the art from the following description.

DETAILED DESCRIPTION OF THE INVENTION

Figure 1:
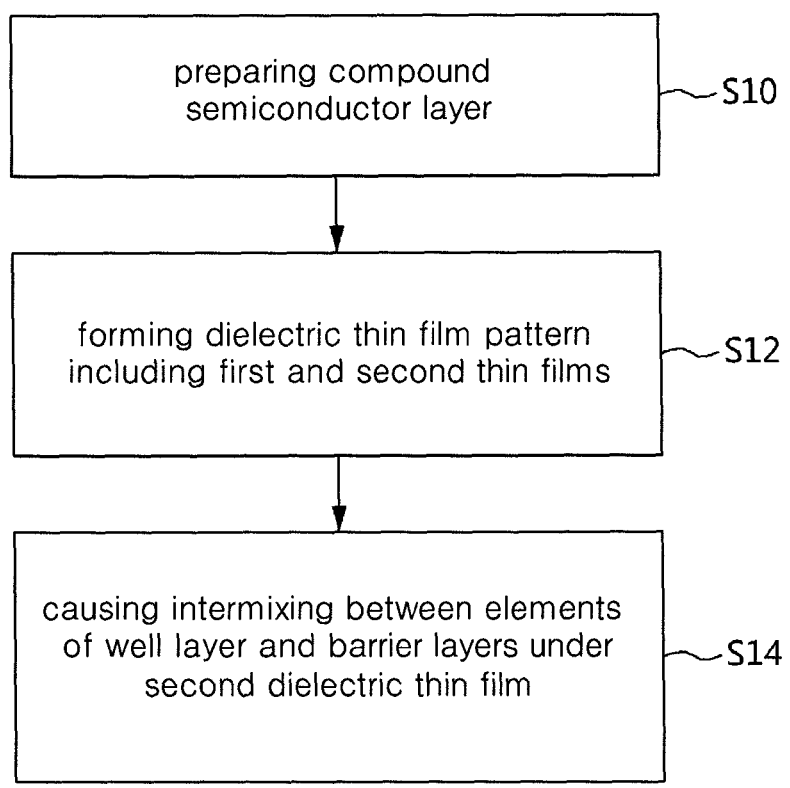
FIG. 1 a flowchart showing a method for fabricating a quantum dot according to one embodiment of the present invention.

Hereinafter, exemplary embodiments of the present invention will be described with reference to accompanying drawings. The present invention is not limited to the following embodiments, but can be embodied in various forms. The embodiments will make the disclosure of the present invention complete, and allow those skilled in the art to completely comprehend the scope of the present invention. The thickness of layers and regions in the drawings may be curtailed or exaggerated for the purpose of clarity. The same reference numerals will be used to refer to the same elements throughout the specification. If it is determined that description about well known functions or configurations may make the subject matter of the present invention unclear, the details thereof will be omitted.

FIG. 1 is a flowchart showing a method for fabricating a quantum dot according to one embodiment of the present invention.

Referring to FIG. 1, a compound semiconductor layer including a quantum well structure is prepared (S10). The quantum well structure can be formed by sequentially stacking a first barrier layer, a well layer and a second barrier layer. Although the present embodiment discloses the compound semiconductor layer including the single quantum well structure, the present invention is not limited thereto. According to another embodiment of the present invention, the compound semiconductor layer may include a multiple quantum well structure in which at least two well layers are disposed among at least three barrier layers.

The compound semiconductor layer may include the group III-V compound semiconductor layer or the group II-VI compound semiconductor layer. The group III-V compound semiconductor layer may include at least one selected from the group consisting of Al, Ga and In and at least one selected from the group consisting of N, P and As. In addition, the group II-VI compound semiconductor layer may include at least one selected from the group consisting of Be, Mg, Cd and Zn and at least one selected from the group consisting of O, S, Se, and Te. However, the present invention is not limited thereto.

For instance, if the compound semiconductor layer is the group III-V compound semiconductor layer, the well layer may include a GaAs layer and the first and second barrier layers may include AlGaAs layer. In addition, if the compound semiconductor layer is the group II-VI compound semiconductor layer, the well layer may include a ZnO layer and the first and second barrier layers may include MgZnO layer.

The compound semiconductor layer having the quantum well structure can be formed on the substrate through various epitaxial growth technologies. For instance, the first barrier layer, the well layer and the second barrier layer can be sequentially grown through the MBE (molecular beam epitaxy) scheme. In addition, in order to diminish the defect caused by lattice mismatch between the substrate and the compound semiconductor layer, a buffer layer may be formed on the substrate before the compound semiconductor layer is formed. The substrate may be formed of Si, ZnO, GaN, SiC, GaAs, InP, AlN, ScAlMgO$_4$ LiNbO$_3$, Al$_2$O$_3$ or glass, and the buffer layer may include the group III-V compound semiconductor layer or the group II-VI compound semiconductor layer, but the present invention is not limited thereto.

Meanwhile, the substrate and the buffer layer may be selectively removed after the compound semiconductor layer (dielectric thin film pattern described later) has been formed.

After the compound semiconductor layer having the quantum well structure has been formed, a dielectric thin film pattern including a first dielectric thin film having a thermal expansion coefficient higher than that of the second barrier layer and a second dielectric thin film having a thermal expansion coefficient lower than that of the second barrier layer is formed on the second barrier layer (S12). At this time, the first dielectric thin film has a width of nanometer size.

The term "nanometer size" may include several to several hundreds of nanometer scales, and the term "width" refers to a mean width of the dielectric thin film measured along the compound semiconductor layer having the quantum well structure.

The dielectric thin film pattern can be formed through various schemes generally known in the art. For instance, the dielectric thin film pattern can be formed through the electron-beam lithography or electron-beam evaporation.

In detail, the dielectric thin film pattern can be formed through the procedure shown in FIGS. 2a to 2e.

Figure 2A:
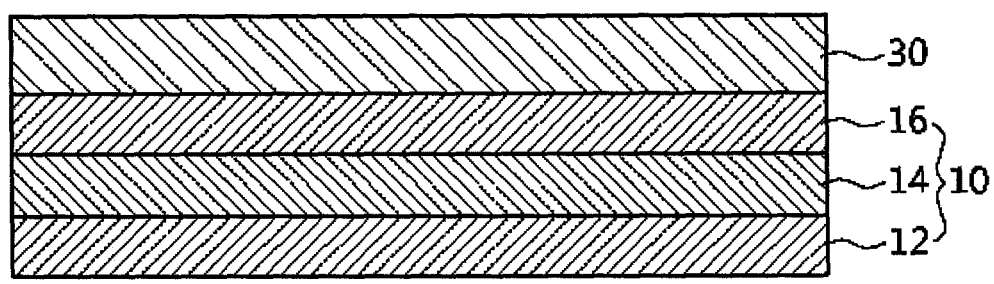
FIGS. 2a to 2e are sectional views showing the procedure for forming a dielectric thin film pattern on a compound semiconductor layer including a quantum well structure.

Referring to FIG. 2a, a resist layer 30 is formed on a second barrier layer 16 of a compound semiconductor layer 10. The resist layer 30 may include, without limitation, a polymer material having the etching rate higher than that of the compound semiconductor layer 10 formed under the resist layer 30. The resist layer 30 can be coated on the second barrier layer 16 through a typical solution process. For instance, the polymer material may include polymethylmethacrylate (PMMA), polyacrylic acid, polyvinylalcohol (PVA), polystyrene, or polyamine.

Figure 2B:
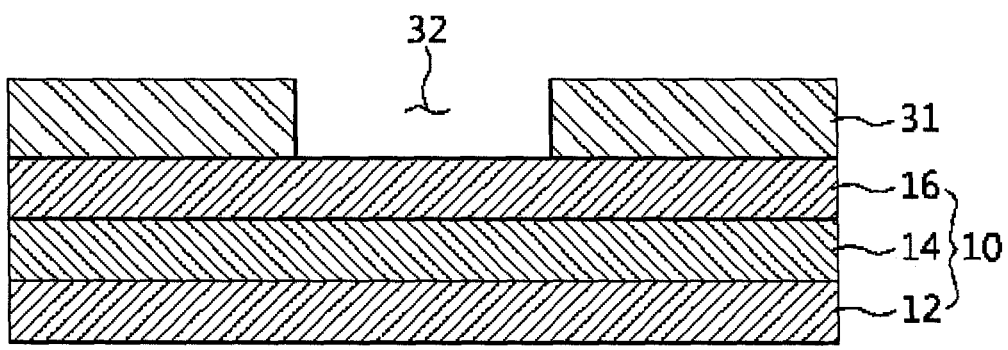

Referring to FIG. 2b, the resist layer 30 is etched to form a hole pattern 32 that exposes a part of the second barrier layer 15. The etching process can be performed through the electron-beam lithography. The hole pattern 32 may have a width of nanometer size or a resist layer 31 remaining after the etching process may have a width of nanometer size. Meanwhile, although the present embodiment discloses only one hole pattern, the present invention is not limited thereto. According to another embodiment of the present invention, a plurality of hole patterns can be formed. The hole patterns may have various shapes, such as a cylindrical shape, an oval column shape or a polygonal column shape.

Figure 2C:
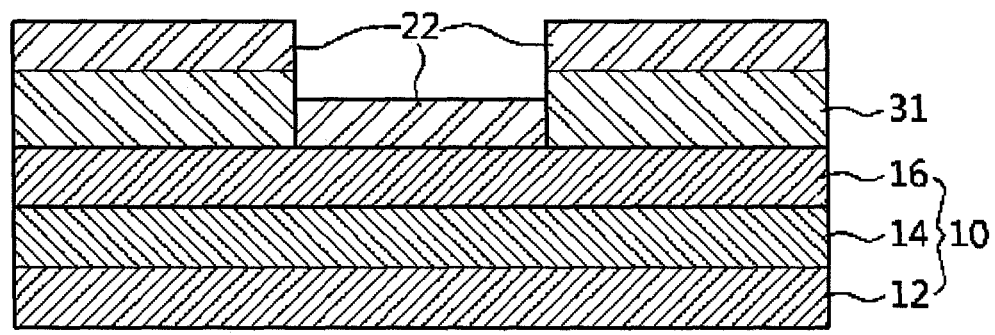

Referring to FIG. 2c, one of the first and second dielectric thin films is deposited on the exposed part of the second barrier layer 16. The deposition process can be performed through the electron-beam evaporation. According to the present embodiment, the first dielectric thin film 22 is deposited on the exposed part of the second barrier layer 16.

The first and second dielectric thin films may include metal oxide layers. The metal oxide layers may include at least one selected from the group consisting of $Al_2O_3$, $HfO_2$, $TiO_2$, $SnO_2$, $SiO_2$ and $ZrO_2$, but the present invention is not limited thereto. For instance, various materials can be used for the metal oxide layers if they have the thermal expansion coefficient different from that of the semiconductor layer formed under the metal oxide layers.

Figure 2D:
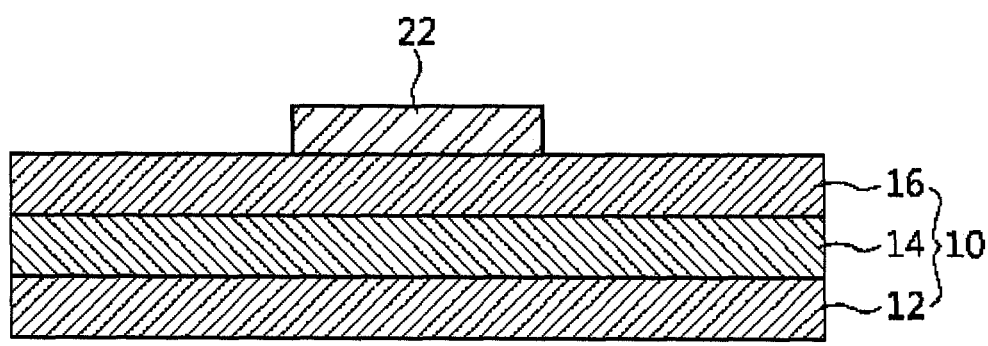
Figure 2E:
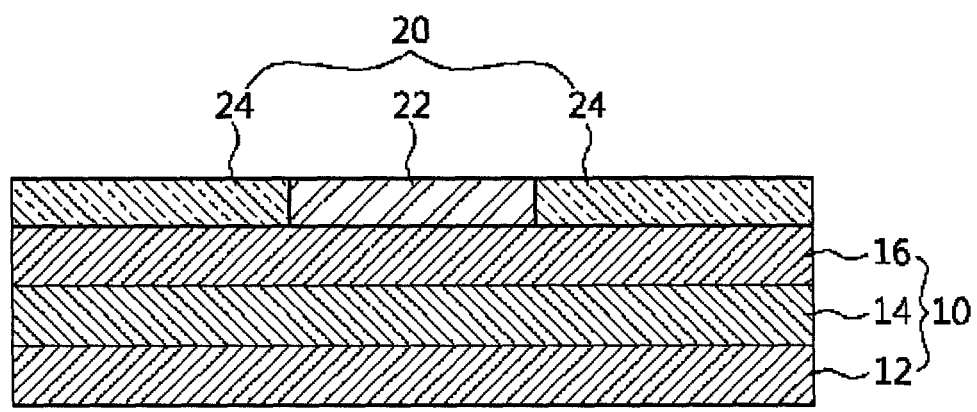

Referring to FIGS. 2d and 2e, after the resist layer 31 remaining on the second barrier layer 16 has been removed (FIG. 2d), the remaining one of the first and second dielectric thin films is deposited on the second barrier layer 16 (FIG. 2e). The remaining resist layer 31 can be removed through the wet etching process, and the deposition process can be performed through the electron-beam evaporation. According to the present embodiment, the remaining one of the first and second dielectric thin films is the second dielectric thin film 24 (a part of the second dielectric thin film deposited on the first dielectric thin film 22 is not shown in the drawings). Thus, the dielectric thin film pattern 20 including the first and second thin films 22 and 24 can be formed.

Referring again to FIG. 1, the compound semiconductor layer formed with the dielectric thin film pattern is subject to the heat treatment process, so that elements of the well layer are intermixed with elements of the barrier layers at the region of the compound semiconductor layer formed under the second dielectric thin film (S14).

The term "intermixing" refers to the mixing of at least two elements through the heat treatment process and the bandgap of the well layer region located under the second dielectric thin film can be changed through the intermixing.

The intermixing may be determined depending on the difference in the thermal expansion coefficient between the second barrier layer and the dielectric thin film formed on the second barrier layer. If the thermal expansion coefficient of the dielectric thin film is higher than that of the second barrier layer, the tensile strain may occur between the dielectric thin film and the second barrier layer so that the intermixing is restricted. In addition, if the thermal expansion coefficient of the dielectric thin film is lower than that of the second barrier layer, the compressive strain may occur between the dielectric thin film and the second barrier layer so that the intermixing is promoted. Therefore, when the dielectric thin film pattern including the first and second dielectric films is formed on the second barrier layer of the compound semiconductor layer having the quantum well structure, one of the first and second dielectric thin films may include the material having the thermal expansion coefficient higher than that of the second barrier layer and the remaining one of the first and second dielectric thin films may include the material having the thermal expansion coefficient lower than that of the second barrier layer in such a manner that the bandgap of the well layer in the quantum well structure can be selectively changed through the heat treatment process.

Preferably, in order to facilitate the intermixing, the heat treatment process is rapidly performed at the temperature similar to the growth temperature of the semiconductor layer including the quantum well structure. In detail, the heat treatment process is performed for 50 seconds to 200 seconds at the temperature in the range of 300° C. to 900° C. For instance, when the group II-VI compound semiconductor layer is used, the rapid heat treatment process is performed at the temperature in the range of 300° C. to 500° C. In addition, when the group III-V compound semiconductor layer is used, the rapid heat treatment process is performed at the temperature in the range of 800° C. to 900° C.

Therefore, according to the present embodiment, the intermixing may occur between the elements of the well layer and the elements of the barrier layers formed under the second dielectric thin film, so the bandgap of the well layer region under the second dielectric thin film may be widened. In addition, the intermixing between the elements of the well layer and the elements of the barrier layers formed under the first dielectric thin film may be restricted, so the bandgap of the well layer region under the first dielectric thin film may not be changed. Thus, the quantum dot, by which the electrons and holes are subject to the three-dimension confinement, is formed at the well layer region formed under the first dielectric thin film.

Therefore, according to the present invention, the size, concentration and growth position of the quantum dot can be selectively controlled according to the size, shape and position of the dielectric thin film pattern. In addition, since the quantum dot can be formed through a simple process, such as the rapid heat treatment process, at the temperature similar to the growth temperature of the semiconductor layer, the defects can be diminished during the process.

Meanwhile, after the above procedure has been completed, a step of removing the dielectric thin film pattern can be performed. In detail, after the quantum dot has been formed in the quantum well structure through the above procedure, the dielectric thin film pattern used to form the quantum dot can be removed. This is advantageous when the structure containing the quantum dot is applied to a specific device because the dielectric thin film pattern may not match with the function of the specific device or may exert bad influence upon the performance of the specific device.

In addition, although it has been described that the dielectric thin film pattern is directly formed on the second barrier layer in the method for fabricating the quantum dot according to the embodiment, the present invention is not limited thereto.

Hereinafter, the exemplary experimental examples will be described such that those skilled in the art can comprehend the present invention. However, the exemplary experimental examples are illustrative purpose only and the present invention is not limited thereto.

Fabrication Example 1

Fabrication of GaAs/AlGaAs Quantum Well

A GaAs/AlGaAs quantum well was grown through the MBE (molecular beam epitaxy).

First, a thick GaAs buffer layer was grown on a GaAs substrate, and a 20 nm $Al_{0.45}Ga_{0.55}As$ clad layer, a 40-50 nm $Al_{0.3}Ga_{0.7}As$ barrier layer, a 5 nm GaAs well layer, a 40-50 nm $Al_{0.3}Ga_{0.7}As$ barrier layer, a 20 nm $Al_{0.45}Ga_{0.55}As$ clad layer and a 5 nm GaAs cover layer were sequentially grown to form the semiconductor layer including the quantum well structure.

Fabrication Example 2

Fabrication of Dielectric Thin Film Pattern

A dielectric thin film pattern including $TiO_2$ and $SiO_2$ was deposited on the quantum well sample fabricated through fabrication example 1 by using the electron beam lithography and the electron beam evaporation.

1) PMMA (polymethylmethacrylate) was coated on a GaAs cover layer (thermal expansion coefficient: $6.3 \times 10^{-6}$ °$C.^{-1}$) of the quantum well sample fabricated through fabrication example 1 to form a resist layer, and a part of the resist layer was etched through the electron beam lithography, thereby forming a hole pattern having a width of about 70 nm to expose a part of the cover layer.

2) 100 nm $TiO_2$ (thermal expansion coefficient: $8.2 \times 10^{-6 o} C.^{-1}$) was deposited on the quantum well sample having the hole pattern through the electron beam evaporation.

3) The PMMA resist layer and $TiO_2$ formed on the resist layer were removed by using acetone.

4) 100 nm $SiO_2$ (thermal expansion coefficient: $0.52 \times 10^{-6 o} C.^{-1}$) was deposited on the quantum well sample, on which the $TiO_2$ was deposited, through the electron beam evaporation.

Fabrication Example 3

Fabrication of Quantum Dot Through Rapid Heat Treatment Process

The quantum well sample, on which the dielectric thin film pattern including $TiO_2$ and $SiO_2$ was deposited, fabricated through fabrication example 2 was loaded in rapid heat treatment equipment and the quantum well sample was heat-treated for 150 seconds at the temperature of 850° C.

The micro photoluminescence of the semiconductor structure containing the quantum dot fabricated through fabrication example 3 was measured at a low temperature condition (6 K) by using an $Nd:YVO_4$ laser having the wavelength of 532 nm.

Figure 3:
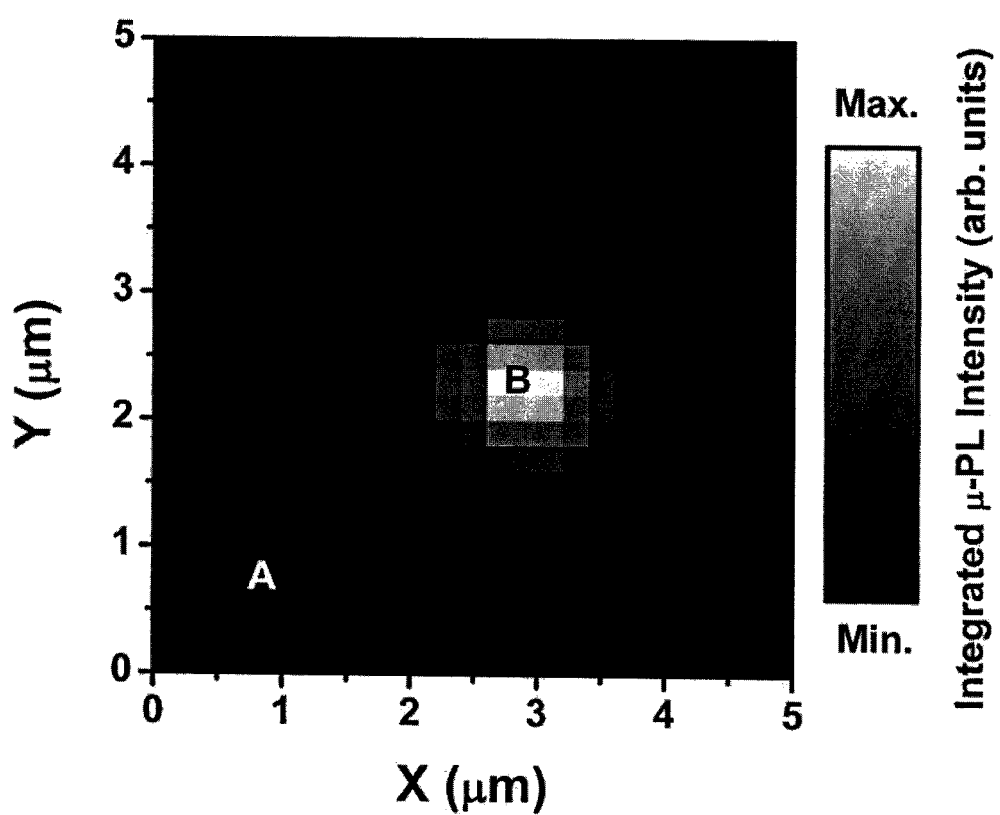
FIG. 3 is a micro photoluminescence image of a semiconductor structure containing a quantum dot fabricated according to one embodiment of the present invention.

FIG. 3 is a micro photoluminescence image of the semiconductor structure containing the quantum dot fabricated according to fabrication example 3.

Figure 4:
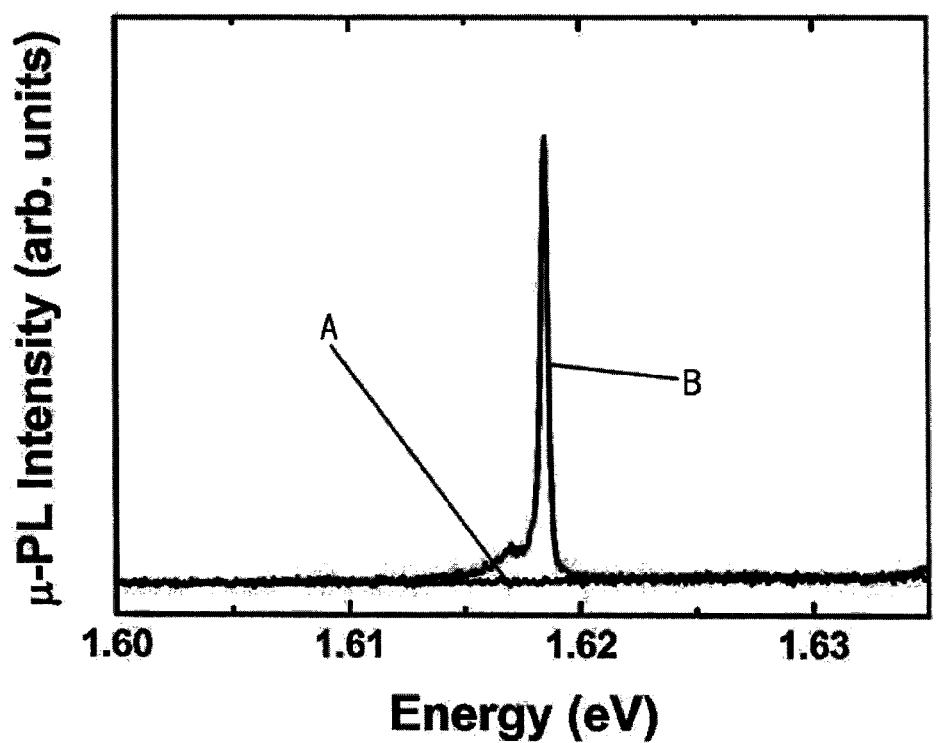
FIG. 4 is a graph showing a micro photoluminescence spectrum of A and B regions shown in FIG. 3.

FIG. 4 is a graph showing a micro photoluminescence spectrum of A and B regions shown in FIG. 3.

Referring to FIGS. 3 and 4, the photoluminescence corresponding to the quantum dot spectrum was found at the region B where the $TiO_2$ was deposited, and the photoluminescence was not found at the region A where the $SiO_2$ was deposited. Thus, the intermixing may occur between the elements of the well layer and the elements of the barrier layers under the region A where the $SiO_2$ is deposited, so the bandgap of the well layer is widened. Thus, it is determined that the three-dimension confinement occurs at the well layer under the region B where the $TiO_2$ is deposited.

Although exemplary embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A method for fabricating a quantum dot, the method comprising:
    (a) preparing a compound semiconductor layer including a quantum well structure formed by sequentially stacking a first barrier layer, a well layer and a second barrier layer;
    (b) forming a dielectric thin film pattern on the second barrier layer comprising:
        forming a resist layer on the second barrier layer;
        etching the resist layer to form a hole pattern that exposes a part of the second barrier layer;
        depositing one of a dielectric thin film selected from the group consisting of a first dielectric thin film having a thermal expansion coefficient higher than a thermal expansion coefficient of the second barrier layer and a second dielectric thin film having a thermal expansion coefficient lower than the thermal expansion coefficient of the second barrier layer on the exposed part of the second barrier layer such that the dielectric thin film has a width of nanometer size; and
        removing the resist layer remaining on the second barrier layer and depositing the remaining dielectric thin film selected from the group consisting of the first dielectric thin film and the second dielectric thin film on the second barrier layer; and
    (c) heat-treating the compound semiconductor layer formed thereon with the dielectric thin film pattern to cause an intermixing between elements of the well layer and elements of the barrier layers at a region of the compound semiconductor layer under the second dielectric thin film.

2. The method of claim 1, wherein the compound semiconductor layer includes a group III-V compound semiconductor layer or a group II-VI compound semiconductor layer.

3. The method of claim 1, wherein, in step (c), the heat treatment is performed for 50 seconds to 200 seconds at a temperature in a range of 300° C. to 900° C.

4. The method of claim 1, further comprising removing the dielectric thin film pattern after step (c).

5. The method of claim 1, wherein the first and second dielectric thin films include metal oxide layers.

6. The method of claim 5, wherein the metal oxide layers include at least one selected from the group consisting of $Al_2O_3$, $HfO_2$, $TiO_2$, $SnO_2$, $SiO_2$ and $ZrO_2$.

* * * * *